United States Patent
Tang

(10) Patent No.: US 8,694,850 B1
(45) Date of Patent: *Apr. 8, 2014

(54) FAST ERASURE DECODING FOR PRODUCT CODE COLUMNS

(75) Inventor: Heng Tang, Sunnyvale, CA (US)

(73) Assignee: Marvell International Ltd., Hamilton (BM)

(*) Notice: Subject to any disclaimer, the term of this patent is extended or adjusted under 35 U.S.C. 154(b) by 0 days.

This patent is subject to a terminal disclaimer.

(21) Appl. No.: 13/486,917

(22) Filed: Jun. 1, 2012

Related U.S. Application Data

(63) Continuation of application No. 12/056,034, filed on Mar. 26, 2008, now Pat. No. 8,196,004.

(60) Provisional application No. 60/908,282, filed on Mar. 27, 2007.

(51) Int. Cl.
*H03M 13/00* (2006.01)

(52) U.S. Cl.
USPC .......................................................... 714/755

(58) Field of Classification Search
None
See application file for complete search history.

(56) References Cited

U.S. PATENT DOCUMENTS

| | | | |
|---|---|---|---|
| 5,631,914 A | 5/1997 | Kashida et al. |
| 5,684,810 A | 11/1997 | Nakamura et al. |
| 5,757,825 A | 5/1998 | Kimura et al. |
| 5,974,580 A | 10/1999 | Zook et al. |
| 6,047,395 A | 4/2000 | Zook |
| 6,158,038 A | 12/2000 | Yamawaki et al. |
| 6,738,942 B1 | 5/2004 | Sridharan et al. |
| 2005/0182998 A1 | 8/2005 | Cucchi et al. |

OTHER PUBLICATIONS

Argon et al., "Iterative Application of the Chase Algorithm on Reed-Solomon Product Codes," 2001 IEEE.

*Primary Examiner* — Gabriel Chu

(57) ABSTRACT

A method, computer-readable medium storing instructions, and apparatus for decoding column codewords of a two-dimensional product code having intersecting row and column codewords is presented that reduces the number of computations needed to decode a column codeword. The method includes computing an error location polynomial for all column codewords based on known failure locations in intersecting row codewords, computing a syndrome polynomial for each column codeword, and correcting errors in the column codeword according to error evaluation values generated based on the syndrome polynomial and the stored error location polynomial.

20 Claims, 4 Drawing Sheets

US 8,694,850 B1

FAST ERASURE DECODING FOR PRODUCT CODE COLUMNS

RELATED APPLICATIONS

This application is a continuation of U.S. patent application Ser. No. 12/056,034, filed Mar. 26, 2008, which claims benefit of U.S. Provisional Application No. 60/908,282, filed Mar. 27, 2007, which are incorporated herein by reference in their entireties.

FIELD

The present invention relates generally to decoding information and, more particularly, to methods and systems for fast erasure decoding of non-binary product codes column codewords.

BACKGROUND

The ability to store and transmit digital information is central to the operation of most electronic systems. Stored or transmitted digital information often becomes corrupted, however, due to the introduction of data errors during storing or transmission. Data errors can commonly be caused by, for example, noise in a transmission channel, errors generated during read/write processes, and physical defects in a storage medium. Accordingly, detecting and correcting data errors proves essential to ensuring accurate storage and transmission of digital information in electronic systems.

Error correction coding ("ECC") may be utilized to detect data errors and make necessary corrections to corrupted digital information, thereby improving overall data storage and transmission reliability. FIG. 1 illustrates a block diagram of a generalized system 100 implementing ECC methods. Data received from transmitter 102 is encoded by encoder 104. During data encoding, error checking information (e.g., parity bits, redundant data) is added to the data (e.g., appended, prefixed). Noise and other contributing factors may cause data errors 106 to be introduced to the digital signal during either the transmission or the storing processes, thereby corrupting the digital information. Decoder 108 decodes the received information and determines whether the digital information has been corrupted during transmission or storage based on the embedded error checking information. If decoder 108 determines that data errors are present, the locations of the data errors are determined and corresponding corrections are made. Once decoded, the digital information is then passed to a receiver 110. Transmitter 102 and encoder 104 may be integrated into a single module. Similarly, decoder 106 may be integrated with receiver 110 in a single module.

Encoded digital information may be arranged in codewords, each codeword having corresponding embedded error checking information to ensure the integrity of the codeword during storing or transmission. In particular, codewords may be arranged in two-dimensional arrays called product codes. FIG. 2 illustrates a product code 200 comprised of row codewords arranged in rows 202, column codewords arranged in columns 204, and corresponding embedded error checking information 206-208. As illustrated, row and column codeword error checking information 206, 208 is appended to the corresponding row and column codewords, however, row and column error checking information 206, 208 may be added to other locations around (or within) a codeword. Additional error checking information 210 may also be included in the product code 200 to determine whether the row and column error checking information 206, 208 has been corrupted during storage or transmission. By employing two-dimensional error checking capability, use of product codes in ECC can increase overall error decoding accuracy.

In a system implementing ECC, decoder 108 must decode each row codeword and column codeword in a received product code 200 iteratively until the information contained within the received product code is free of errors. This decoding process requires multiple computations (thereby introducing latencies), consumes significant amounts of power, and requires considerable hardware layout area to implement.

SUMMARY

In accordance with at least one embodiment of the invention, a method for decoding an encoded column codeword of a two-dimensional product code having intersecting row and column codewords comprises computing an error location polynomial for all column codewords based on known failure locations in intersecting row codewords, computing a syndrome polynomial for a column codeword, and correcting errors in the column codeword according to error evaluation values generated based on the syndrome polynomial and the error location polynomial.

In accordance with at least one embodiment of the invention, a computer-readable medium storing computer programs executable by a computer to perform a method for decoding an encoded column codeword of a two-dimensional product code having intersecting row and column codewords, wherein the method comprises computing an error location polynomial for all column codewords based on known failure locations in intersecting row codewords, computing a syndrome polynomial for a column codeword, and correcting errors in the column codeword according to error evaluation values generated based on the syndrome polynomial and the error location polynomial.

In accordance with at least one embodiment of the invention, an apparatus for decoding an encoded column codeword of a two-dimensional product code having intersecting row and column codewords comprises a processor system, a memory, and instructions stored in the memory that enable the processor system to compute an error location polynomial for all column codewords based on known failure locations in intersecting row codewords, compute a syndrome polynomial for a column codeword, and correct errors in the column codeword according to error evaluation values generated based on the syndrome polynomial and the error location polynomial.

Advantages of the invention will be set forth in part in the description which follows, and in part will be obvious from the description, or may be learned by practice of the invention. The advantages of the invention may be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments consistent with the invention and together with the description, serve to explain the principles of the invention.

DESCRIPTION OF THE EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
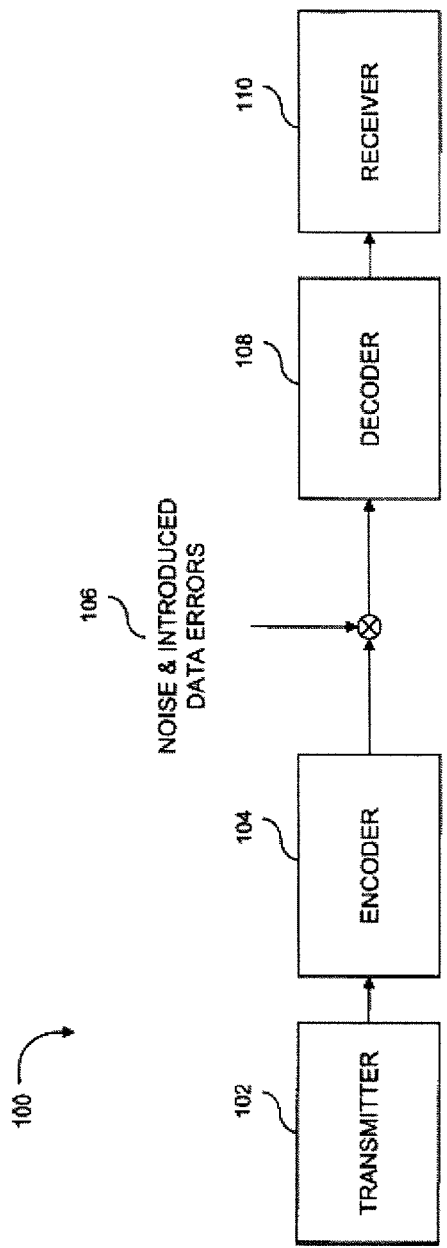
FIG. 1 illustrates a block diagram of a generalized system implementing ECC.
Figure 2:
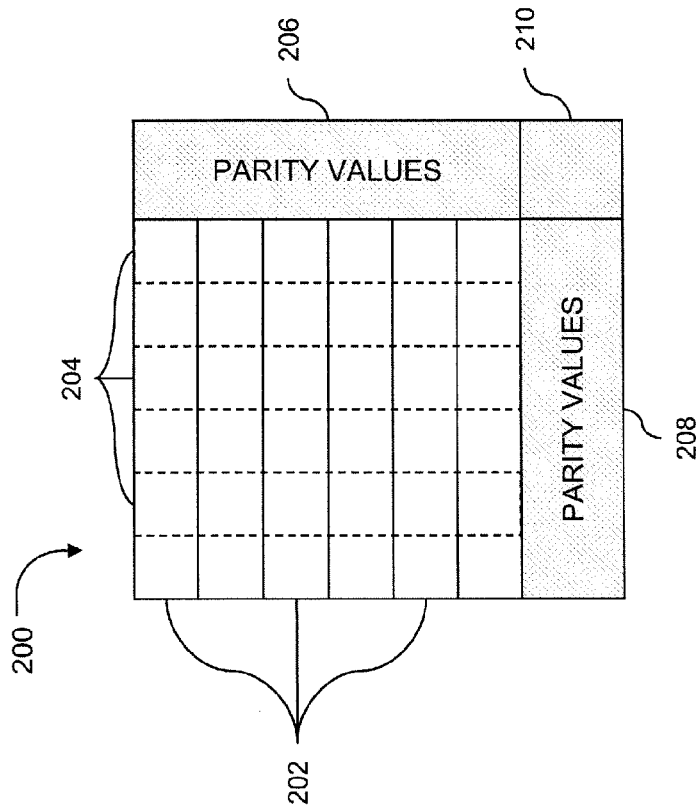
FIG. 2 is an illustration of a two-dimensional product code including row codewords and column codewords.

ECCs utilizing codewords and product codes can be implemented using Reed-Solomon ("RS") coding schemes. RS codes can be classified within a specialized subset of non-binary Bose-Chaudhuri-Hocquenghen ("BCH") coding. For example, each row and column of the product code illustrated in FIG. 2 may represent a RS codeword. ECCs may implement two types of decoding schemes: error decoding and erasure decoding. Error decoding may be applied when the locations of errors are unknown. Erasure decoding may be applied when error locations are known. In some embodiments, unconfirmed but suspicious error locations may be marked as erasure locations (i.e., erasures) for erasure decoding.

Column codewords may be encoded at the transmitter prior to row codewords being encoded. Similarly, at the receiver, row codewords may be decoded prior to column codewords being decoded. After row codewords have been decoded, failed row codewords may be marked as erasures. In accordance with some embodiments of the present invention, the locations of the failed row codewords marked as erasures may be used subsequently in column decoding.

RS coding may be treated as a q-ary cyclic code. In some embodiments, an (n,k) q-ary cyclic code may comprise codewords of the form $c_0, c_1, \ldots c_{n-1}$, and the polynomial representation of such codewords, which may be expressed by the following:

$$c_0+c_1x+\ldots+c_{n-1}x^{n-1} \qquad \text{Equation (1)}$$

The polynomial representation of the codewords may be divisible by a generator polynomial g(x) of the cyclic code given by:

$$g(x)=g_0+g_1x+g_2x^2+\ldots+g_{n-k}x^{n-k} \qquad \text{Equation (2)}$$

wherein $c_i$ and $g_i$ are elements of a finite field denoted by GF(q). Finite field GF(q) may comprise at least one primitive element, which may be denoted by $\alpha$.

A t-correcting RS code may be generated by a generator polynomial. In some embodiments, a generator polynomial may be given by:

$$g(x) = \prod_{j=b}^{2t+b-1} (x - \alpha^j) \qquad \text{Equation (3)}$$

wherein b is an arbitrary integer and t is the error correcting capability of the RS code. In some embodiments, a b value of either 0 or 1 may be used. For exemplary purposes, a b value of 0 is used in the following description. It is noted, however, that embodiments of the invention may be implemented using any arbitrary b value.

Figure 3:
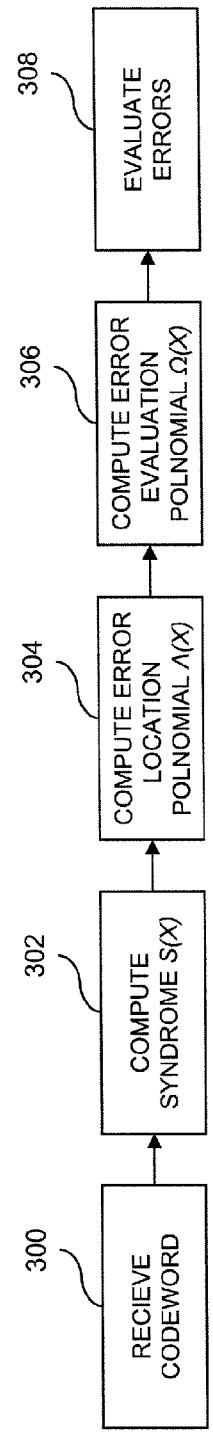
FIG. 3 is an illustration of the generalized decoding process in a RS coding scheme.

RS and BCH coding generally follow the same encoding and decoding processes. FIG. 3 illustrates a generalized decoding process in a RS coding implementation. Based on a codeword received 300 by the decoder system 104, which in some embodiments may be given by $r(x)=r_0+r_1x+r_2x^2+\ldots+r_{n-1}x^{n-1}$, and error checking information is included in the codeword, a codeword syndrome S(X) may be calculated 302. In some embodiments, syndrome S(X) may be given by:

$$S(X)=S_0+S_1X+\ldots+S_{2t-1}X^{2t-1} \qquad \text{Equation (4)}$$

wherein $S_i$ is the computed by evaluating r(x) at the 2t roots of g(x), namely, $1, \alpha, \alpha^2, \ldots, \alpha^{2t-1}$. Codeword syndrome S(X) indicates whether noise during the storage or transmission processes has corrupted the codeword. For example, if S(X) =0, the received sequence may be deemed a valid RS codeword without any errors.

At step 304, an error location polynomial $\Lambda(X)$ may be computed, the roots of which may determine the location of data errors within each codeword. Error location polynomial $\Lambda(X)$ may be computed according to several different complex algorithms, such as, for example the Berlekamp-Massey Algorithm ("BMA") and the Euclidean Algorithm. For erasure-only decoding, however, $\Lambda(X)$ may be given by:

$$\Lambda(X) = \prod_{i=1}^{2t} (1 - \alpha^{-j_i} X), \qquad \text{Equation (5)}$$

wherein $j_i$ is the ith erasure location in a codeword.

At step 306, error evaluation polynomial $\Omega(X)$ may be computed. Error evaluation polynomial $\Omega(X)$ may be given by:

$$\Omega(X)=S(X)\Lambda(X) \bmod X^{2t} \qquad \text{Equation (6)}$$

Finally, at step 308, errors may be evaluated and corrected using the error evaluation polynomial $\Omega(X)$ and known error locations according to:

$$\frac{\Omega(X)}{X^2\Lambda(X)}\bigg|_{X=X_1, X_2, \ldots, X_{2t}} \qquad \text{Equation (7)}$$

Figure 4:
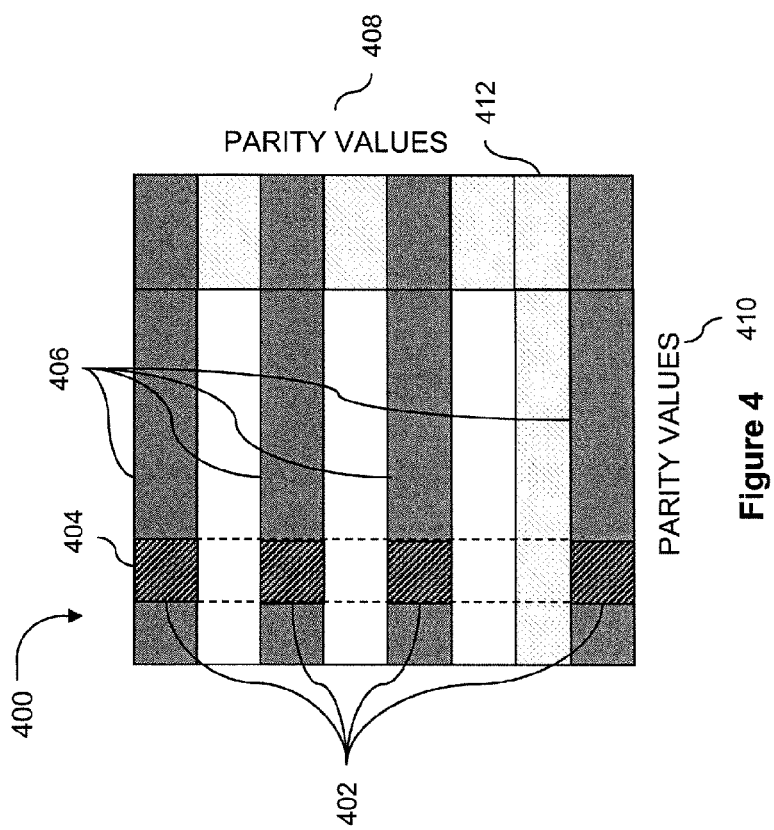
FIG. 4 is an illustration of a two-dimensional product code implementing at least one embodiment of the present invention.

In accordance with some embodiments of the present invention, the number of computations needed to decode a two-dimensional product code may be reduced by utilizing error location information calculated during row codeword decoding for column codeword decoding. FIG. 4 is an illustration of a two-dimensional product code 400 implementing at least one embodiment of the present invention. Two-dimensional product code 400 comprises row codewords arranged in rows 406, column codewords arranged in columns 404, and corresponding embedded error checking information 408-412.

Due to the intersection of row codewords and column codewords in the two-dimensional product code 400, erasure locations for column codewords may be determined based on intersecting row codeword error locations. Column codeword error locations are the same for all column codewords. Accordingly, once row codeword decoding has been performed, column codeword error locations need not be calculated independently as column codeword erasure locations may be determined based on previously computed row codeword error locations. This method of product code decoding allows for error-only decoding to be performed for row codewords and erasure-only decoding for column codewords, thereby reducing the overall number of computations needed to decode a two-dimensional product code. In this manner, computation latencies, power consumption, and hardware layout area may also be reduced.

The following equations illustrate how the implementation of embodiments of the present invention may reduce the number of computations needed to decode a column codeword in a two-dimensional product code. An error evaluation polynomial $\Omega(X)$ for a column codeword may, for example, be given by:

$$\Omega(X) = \Lambda(X)S(X) \bmod X^{2t} \quad \text{Equation (8)}$$

wherein $\Lambda(X)$ is the error location polynomial for the column codeword computed based on the erasure information provided by row decoding, $S(X)$ is the column codeword syndrome, and 2t represents the known error locations (i.e., erasure locations) in the codeword. In some embodiments, if the number of known error locations determined during row decoding is smaller than 2t, rows may be randomly marked as erasures such that at least 2t marked error locations exist. The expression for error evaluation polynomial $\Omega(X)$ may be simplified according to the following:

$$\Omega(X) = \Lambda(X)S_0 \bmod X^{2t} + \Lambda(X)S_1 \bmod X^{2t} + \ldots + \quad \text{Equation (9)}$$
$$\Lambda(X)S_{2t-1}X^{2t-1} \bmod X^{2t}$$
$$= (\Lambda_0 + \Lambda_1 X + \ldots + \Lambda_{2t-1}X^{2t-1})S_0 + \quad \text{Equation (10)}$$
$$(\Lambda_0 + \Lambda_1 X + \ldots + \Lambda_{2t-2}X^{2t-2})S_1 X + \ldots +$$
$$\Lambda_0 S_{2t-1}X^{2t-1}$$
$$= \tilde{\Lambda}_{2t-1}(X)S_0 + \tilde{\Lambda}_{2t-2}(X)S_1 + \ldots + \tilde{\Lambda}_0 S_{2t-1} \quad \text{Equation (11)}$$

As previously discussed, column codeword error locations $\tilde{\Lambda}_{2t-1}(X), \tilde{\Lambda}_{2t-2}(X), \ldots, \tilde{\Lambda}_0(X)$ may be computed based on intersecting row codeword error locations. Accordingly, the expression above can be split into two parts: a column independent part (i.e., $\tilde{\Lambda}_{2t-1}(X), \tilde{\Lambda}_{2t-2}(X), \ldots, \tilde{\Lambda}_0(X)$) and a column dependent part (i.e., syndromes $S(X)$).

In accordance with some embodiments, the column independent part of error evaluation polynomial $\Omega(X)$ may be pre-computed based on erasure locations determined during row decoding. Accordingly, column codeword errors may be evaluated by:

$$\Omega(X) = \tilde{\Lambda}_{2t-1}(X)S_0 + \tilde{\Lambda}_{2t-2}(X)S_1 + \ldots + \tilde{\Lambda}_0(X)S_{2t-1}|_{X=x_1, x_x, \ldots x_2}, \quad \text{Equation (12)}$$

By reducing the number of computations required to evaluate column codeword errors, computation time, power consumption, and layout area of the transceiver and/or decoding device may be reduced.

Figure 5:
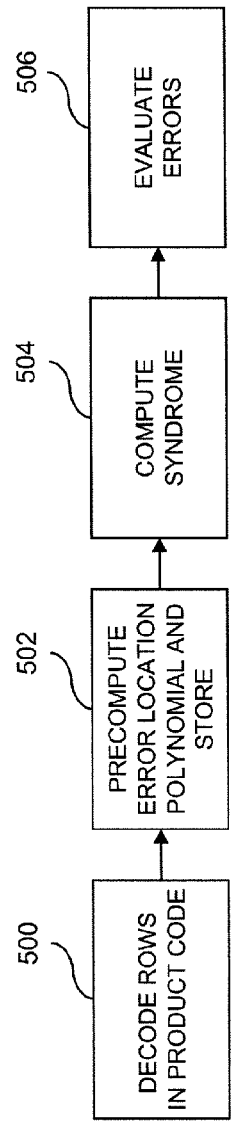
FIG. 5 is an illustration of a column decoding process in an RS coding scheme implementing at least one embodiment of the present invention.

FIG. 5 is an illustration of a column decoding process in an RS coding scheme according to some embodiments of the present invention. At step 500, row codeword decoding may be performed, and failure locations (i.e., erasure locations or erasures) of the row codewords may be determined. During row decoding, if decoding of a specific row codeword fails, all components of the row may be marked as erasures. Based on the determined row codeword failure locations, an error location polynomial may be computed at step 502 for all column codewords that intersect with the row codewords. The column codeword error location polynomial may then be stored in a memory prior to column codeword decoding.

Once all column codeword error locations are pre-computed and stored, column codeword decoding may begin at step 504 by computing syndrome for a column codeword. Errors in the codeword are evaluated at step 506 based on the computed column codeword syndrome and the stored column codeword error location values. Syndrome computation and error evaluation are performed for each encoded column codeword in the two-dimensional product code until all column codewords have been decoded.

Figure 6:
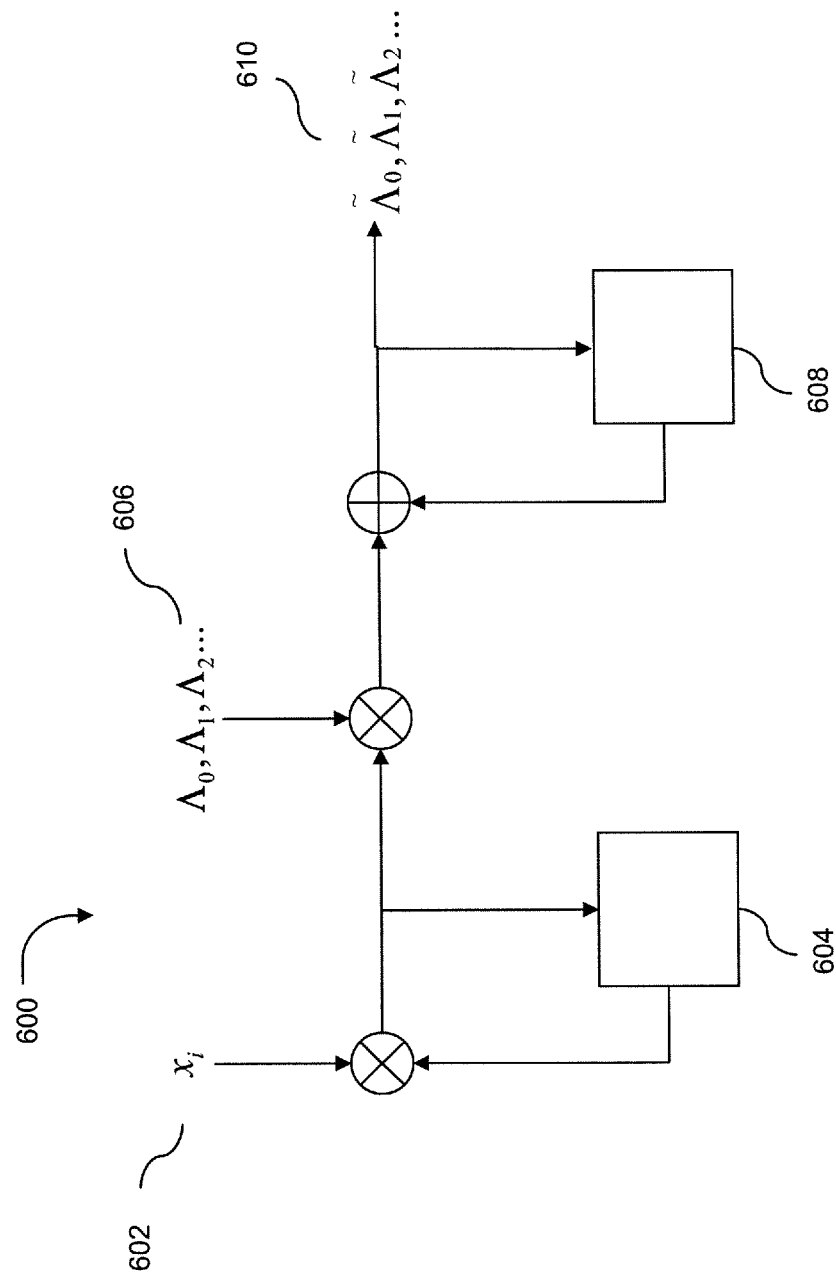
FIG. 6 is an illustration of an exemplary circuit for computing column error locations based on intersecting row failure locations in a two dimensional product code.

FIG. 6 is an illustration of an exemplary circuit 600 for computing column error locations based on corresponding row failure locations in a two dimensional product code. Row failure locations $x_i$ 602 may be used in conjunction with accumulator 604 to compute terms $\Lambda_0, \Lambda_1 x_i, \Lambda_2 x_i^2 \ldots$, where the values of $\Lambda_0, \Lambda_1, \Lambda_2$ are computed using Equation (5). Similarly the computed row error location polynomial coefficient values 606 may be used in conjunction with accumulator 608 to compute the summation of the terms $\Lambda_0, \Lambda_1 x_i, \Lambda_2 x_i^2 \ldots$, and column error location polynomial coefficient values $\tilde{\Lambda}_0, \tilde{\Lambda}_1, \tilde{\Lambda}_2 \ldots$ 610 may be obtained. In some embodiments, accumulator 604 and/or 608 may be implemented using one or more registers. By computing the column error location polynomial based on known row codeword failure locations, the number of computations required to decode a column codeword is reduced, thereby providing savings in computation time, power consumption, and layout area of the transceiver and/or decoding device.

The systems and methods disclosed herein are not inherently related to any particular computer or other apparatus, and may be implemented by a suitable combination of hardware, software, and/or firmware. Software implementations may include one or more computer programs. A computer program is a set of instructions readable and executable by a processor and can be written in any form of programming language, including as a stand alone program or as a module, component, subroutine, or other unit suitable for use in a computing environment. A computer program can be deployed to be executed on one computer or on multiple computers at one site or distributed across multiple sites and interconnected by a communication network. Software may also be implemented as a computer program product, i.e., one or more computer programs tangibly embodied in an information carrier, e.g., in a computer readable medium or in a propagated signal, for execution by, or to control the operation of, a data processing apparatus, e.g., a programmable processor, a computer, or multiple computers.

Other embodiments of the invention will be apparent from consideration of the specification and practice of the invention disclosed herein. It is intended that the specification and examples be considered as exemplary only, with a true scope of the invention being indicated by the following claims.

What is claimed is:

1. A method for decoding a codeword of a multi-dimensional product code, the multi-dimensional product code having intersecting codewords of a first dimension and codewords of a second dimension, the method comprising:
   computing, using decoding circuitry, only one error location polynomial that is used to correct errors in multiple codewords of the second dimension of the multi-dimensional product code based on known failure locations in intersecting codewords of the first dimension;
   computing a syndrome polynomial for a first codeword of the multiple codewords of the second dimension of the multi-dimensional product code; and correcting errors in the first codeword of the multiple codewords of the second dimension according to error evaluation values generated based on the syndrome polynomial for the first codeword of the multiple codewords of the second dimension and the only one error location polynomial that is used to correct errors in multiple codewords of the second dimension.

2. The method of claim 1, wherein computing the only one error location polynomial that is used to correct errors in multiple codewords of the second dimension of the multi-dimensional product code comprises computing the only error location polynomial that is used to correct errors in all codewords of the second dimension of the multi-dimensional product code.

3. The method of claim 1, further including storing codeword error location values corresponding with the only one error location polynomial that is used to correct errors in multiple codewords of the second dimension.

4. The method of claim 1, wherein roots of the only one error location polynomial correspond with codeword error locations of the second dimension.

5. The method of claim 1, wherein location values corresponding with the only one error location polynomial are stored in a table.

6. The method of claim 1, wherein the codewords of the second dimension of the multi-dimensional product code are encoded using Reed-Solomon coding.

7. The method of claim 1, wherein the codewords of the second dimension of the multi-dimensional product code are encoded using non-binary Bose-Chaudhuri-Hocquenghen coding.

8. A non-transitory computer-readable medium, storing computer programs executable by a computer, to perform a method for decoding a codeword of a multi-dimensional product code, the multi-dimensional product code having intersecting codewords of a first dimension and codewords of a second dimension, the method comprising:
    computing only one error location polynomial that is used to correct errors in multiple codewords of the second dimension of the multi-dimensional product code based on known failure locations in intersecting codewords of the first dimension;
    computing a syndrome polynomial for a first codeword of the multiple codewords of the second dimension of the multi-dimensional product code; and
    correcting errors in the first codeword of the multiple codewords of the second dimension according to error evaluation values generated based on the syndrome polynomial for the first codeword of the multiple codewords of the second dimension and the only one error location polynomial that is used to correct errors in multiple codewords of the second dimension.

9. The non-transitory computer-readable medium of claim 8, wherein the only one error location polynomial that is used to correct errors in multiple codewords of the second dimension of the multi-dimensional product code comprises the only one error location polynomial that is used to correct errors in all codewords of the second dimension of the multi-dimensional product code.

10. The non-transitory computer-readable medium of claim 8, wherein the method for decoding the codeword of a multi-dimensional product code further includes storing codeword error location values corresponding with the only one error location polynomial that is used to correct errors in multiple codewords of the second dimension.

11. The non-transitory computer-readable medium of claim 8, wherein roots of the only one error location polynomial correspond with codeword error locations of the second dimension.

12. The non-transitory computer-readable medium of claim 8, wherein location values corresponding with the only one error location polynomial are stored in a table.

13. The non-transitory computer-readable medium of claim 8, wherein the codewords of the second dimension of the multi-dimensional product code are encoded using Reed-Solomon coding.

14. The non-transitory computer-readable medium of claim 8, wherein the codewords of the second dimension of the multi-dimensional product code are encoded using non-binary Bose-Chaudhuri-Hocquenghen coding.

15. A system for decoding a codeword of a multi-dimensional product code, the multi-dimensional product code having intersecting codewords of a first dimension and codewords of a second dimension, the system comprising decoder circuitry configured to:
    compute only one error location polynomial that is used to correct errors in multiple codewords of the second dimension of the multi-dimensional product code based on known failure locations in intersecting codewords of the first dimension;
    compute a syndrome polynomial for a first codeword of the multiple codewords of the second dimension of the multi-dimensional product code; and
    correct errors in the first codeword of the multiple codewords of the second dimension according to error evaluation values generated based on the syndrome polynomial for the first codeword of the multiple codewords of the second dimension and the only one error location polynomial that is used to correct errors in multiple codewords of the second dimension.

16. The system of claim 15, wherein the only one error location polynomial that is used to correct errors in multiple codewords of the second dimension of the multi-dimensional product code comprises the only one error location polynomial that is used to correct errors in all codewords of the second dimension of the multi-dimensional product code.

17. The system of claim 15, wherein the decoder circuitry is further configured to store codeword error location values corresponding with the only one error location polynomial that is used to correct errors in multiple codewords of the second dimension.

18. The system of claim 15, wherein roots of the only one error location polynomial correspond with codeword error locations of the second dimension.

19. The system of claim 15, wherein the codewords of the multi-dimensional product code are encoded using Reed-Solomon coding.

20. The system of claim 15, wherein the codewords of the second dimension of the multi-dimensional product code are encoded using non-binary Bose-Chaudhuri-Hocquenghen coding.

* * * * *